United States Patent
Vlasov (10) Patent No.: US 11,366,718 B2
(45) Date of Patent: Jun. 21, 2022

(54) OPTIMAL READ BIAS TRACKING SYSTEM AND METHOD THEREOF

(71) Applicant: SK hynix Inc., Gyeonggi-do (KR)

(72) Inventor: Teodor Vlasov, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 128 days.

(21) Appl. No.: 16/863,368

(22) Filed: Apr. 30, 2020

(65) Prior Publication Data

US 2021/0342221 A1 Nov. 4, 2021

(51) Int. Cl.
| | | |
|---|---|---|
| *G11C 29/00* | (2006.01) | |
| *G06F 11/10* | (2006.01) | |
| *G06F 11/07* | (2006.01) | |
| *G11C 7/10* | (2006.01) | |
| *G06F 12/0811* | (2016.01) | |
| *G06F 12/0882* | (2016.01) | |

(52) U.S. Cl.
CPC ........ *G06F 11/1068* (2013.01); *G06F 11/076* (2013.01); *G06F 12/0811* (2013.01); *G06F 12/0882* (2013.01); *G11C 7/1012* (2013.01); *G11C 7/1045* (2013.01)

(58) Field of Classification Search
CPC .............. G06F 11/1068; G06F 11/076; G06F 12/0811; G06F 12/0882; G11C 7/1045; G11C 7/1012
See application file for complete search history.

(56) References Cited

U.S. PATENT DOCUMENTS

| | | | |
|---|---|---|---|
| 10,529,432 B2 | 1/2020 | Park | |
| 2014/0029336 A1* | 1/2014 | Venkitachalam | ... G11C 11/5642 365/185.03 |
| 2016/0042797 A1* | 2/2016 | Kim | ........................ G11C 29/52 714/764 |
| 2019/0066803 A1 | 2/2019 | Bhatia et al. | |
| 2019/0243699 A1* | 8/2019 | Jin | ........................ G06F 11/073 |
| 2019/0303240 A1 | 10/2019 | Jeon | |

(Continued)

OTHER PUBLICATIONS

Cai, Y et al., Errors in Flash-Memory-Based Solid-State Drives: Analysis, Mitigation, and Recovery, Hardware Architecture, Jan. 5, 2018, v2.

(Continued)

*Primary Examiner* — Samir W Rizk
(74) *Attorney, Agent, or Firm* — IP & T Group LLP (57) ABSTRACT

A memory system includes a memory device including a plurality of cells associated with multiple pages and a controller. The controller selects a read bias set in response to a read address and modifies the read bias set to generate modified read bias set using one of a plurality of modification arrays. The controller performs a read operation on the select page using the modified read bias set. For a select read bias of the read bias set, the controller accumulates a fail bit count corresponding to a read operation using a select modified read bias of the modified read bias set into the plurality of accumulators using subtraction or addition. When an absolute value of a certain accumulator of the fail bit count is greater than a threshold, the controller shifts the select read bias in a correction direction by a specific magnitude corresponding to the accumulator sign.

20 Claims, 9 Drawing Sheets

(56) References Cited

U.S. PATENT DOCUMENTS

2021/0050067 A1* 2/2021 Oh ..................... G11C 11/5642

OTHER PUBLICATIONS

Hambrey O, Intelligent Read Threshold Tracking to Mitigate Read Retry Requests, Flash Memory Summit 2019, Aug. 2019, Santa Clara, CA.

Pletka R, et al., Management of Next-Generation NAND Flash to Achieve Enterprise-Level Endurance and Latency Targets, ACM Transactions on Storage, Dec. 2018, pp. 33-33:25, vol. 14, No. 4, Zurich.

* cited by examiner

OPTIMAL READ BIAS TRACKING SYSTEM AND METHOD THEREOF

BACKGROUND

1. Field

Embodiments of the present disclosure relate to a scheme for tracking an optimal read bias for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems perform various operations on a memory device including a read operation using a read bias (or level).

SUMMARY

Aspects of the present invention include an apparatus for tracking an optimal read bias in a memory system and a method thereof.

In one aspect, a memory system includes a memory device including a plurality of cells associated with multiple pages and a controller. The controller selects a read bias set including a plurality of read biases in response to an address for reading a select page among the multiple pages. The controller modifies the read bias set to generate a modified read bias set using one of a plurality of modification arrays. The controller performs a read operation on the select page using the modified read bias set. For a select read bias of the read bias set, the controller accumulates a fail bit count corresponding to a read operation using a select modified read bias of the modified read bias set. When the absolute accumulator value is greater than a threshold, the controller updates the select read bias by shifting the select read bias in a correction direction by a specific magnitude corresponding to the accumulator sign.

In another aspect, a method for operating a memory system, which includes a memory device including a plurality of cells associated with multiple pages and a controller. The method includes: selecting a read bias set including a plurality of read biases in response to an address for reading a select page among the multiple pages; modifying the read bias set to generate a modified read bias set using one of a plurality of modification arrays; performing a read operation on the select page using the modified read bias set; accumulating, for a select read bias of the read bias set, a fail bit count corresponding to a read operation using a select modified read bias of the modified read bias set; and when the absolute accumulator value is greater than a threshold, updating the select read bias by shifting the select read bias in a correction direction by a specific magnitude corresponding to the accumulator sign.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
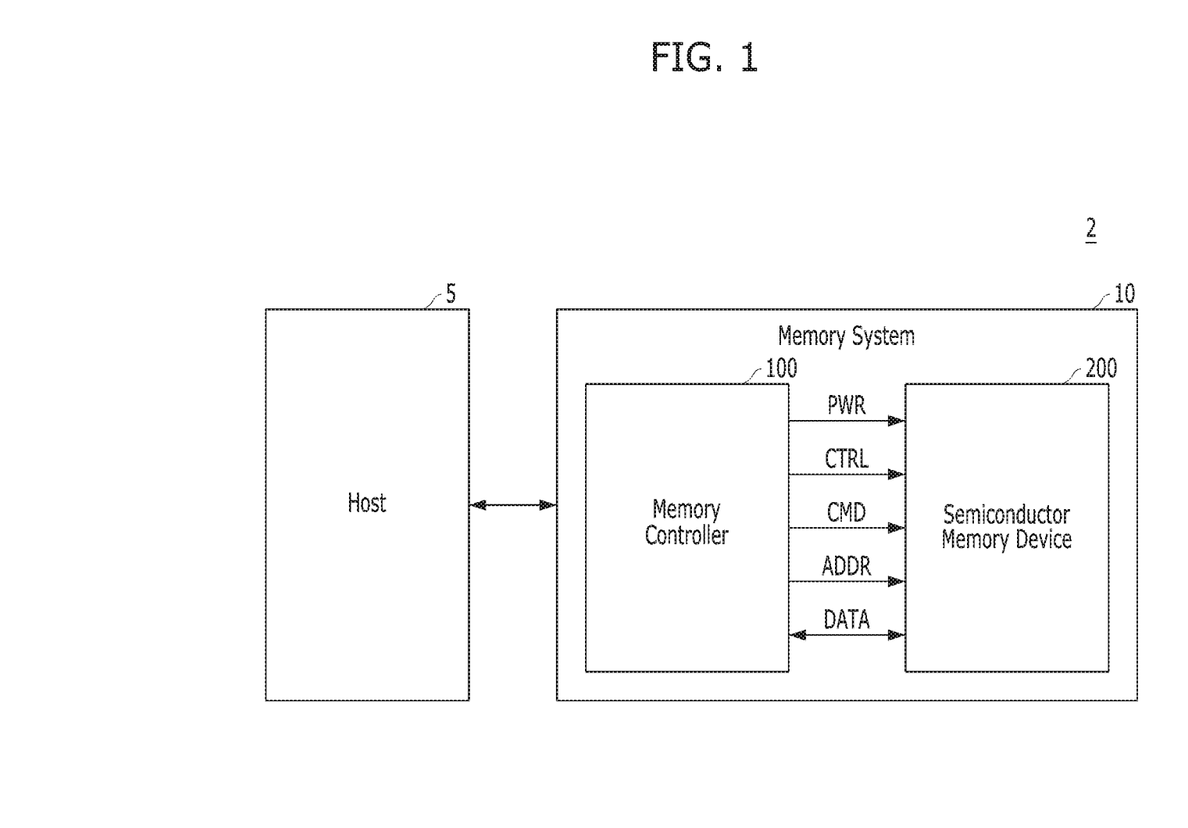
FIG. 1 is a block diagram illustrating a data processing system in accordance with an embodiment of the present invention.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines.

The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

Figure 2:
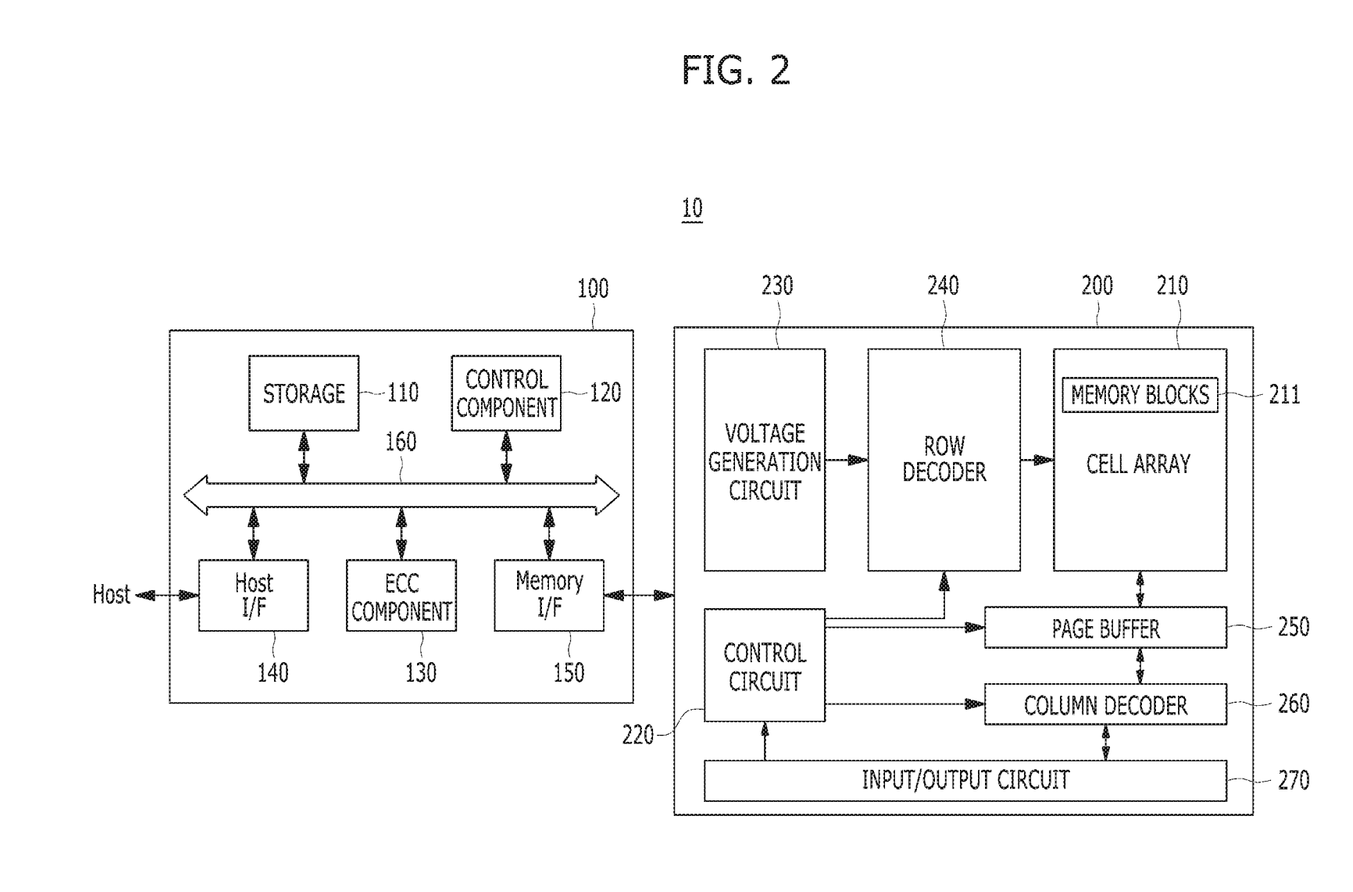
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
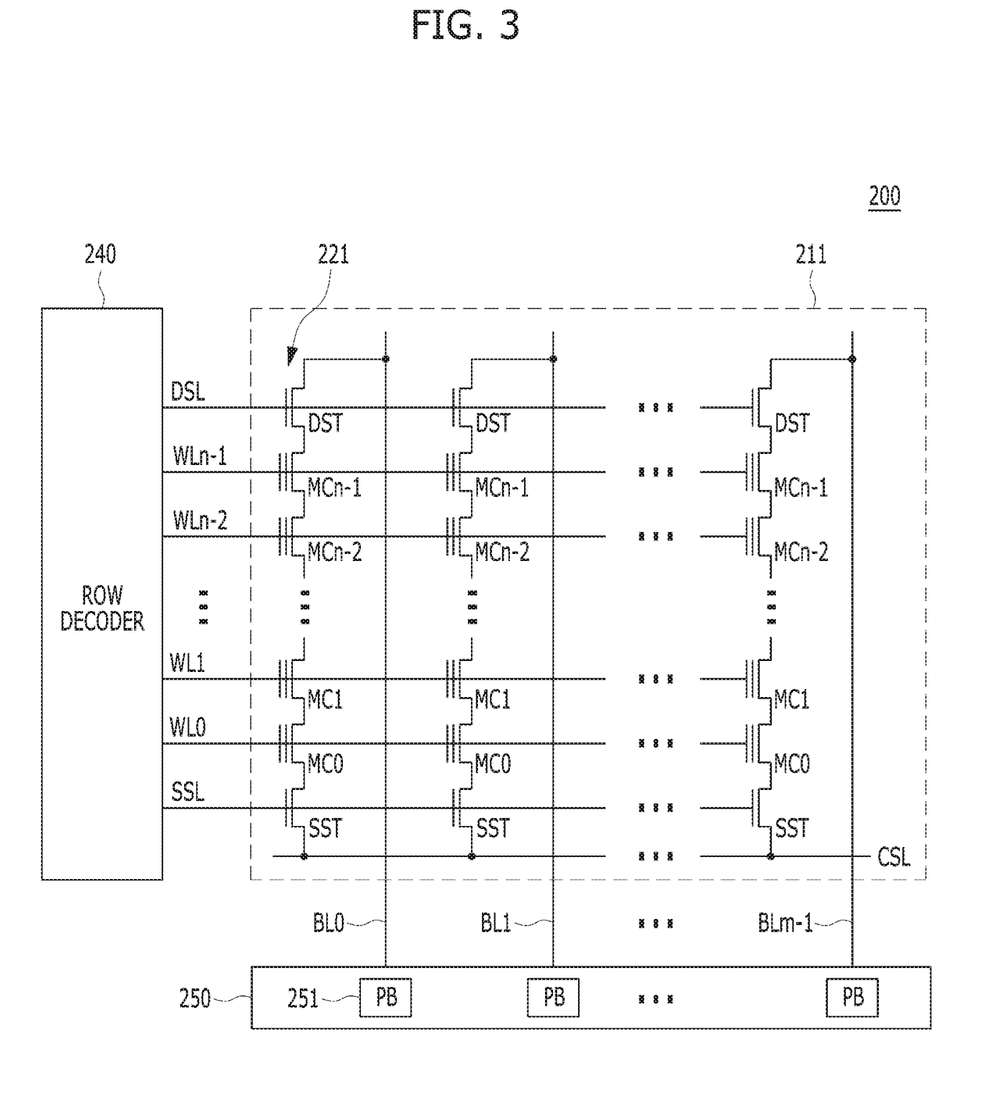
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
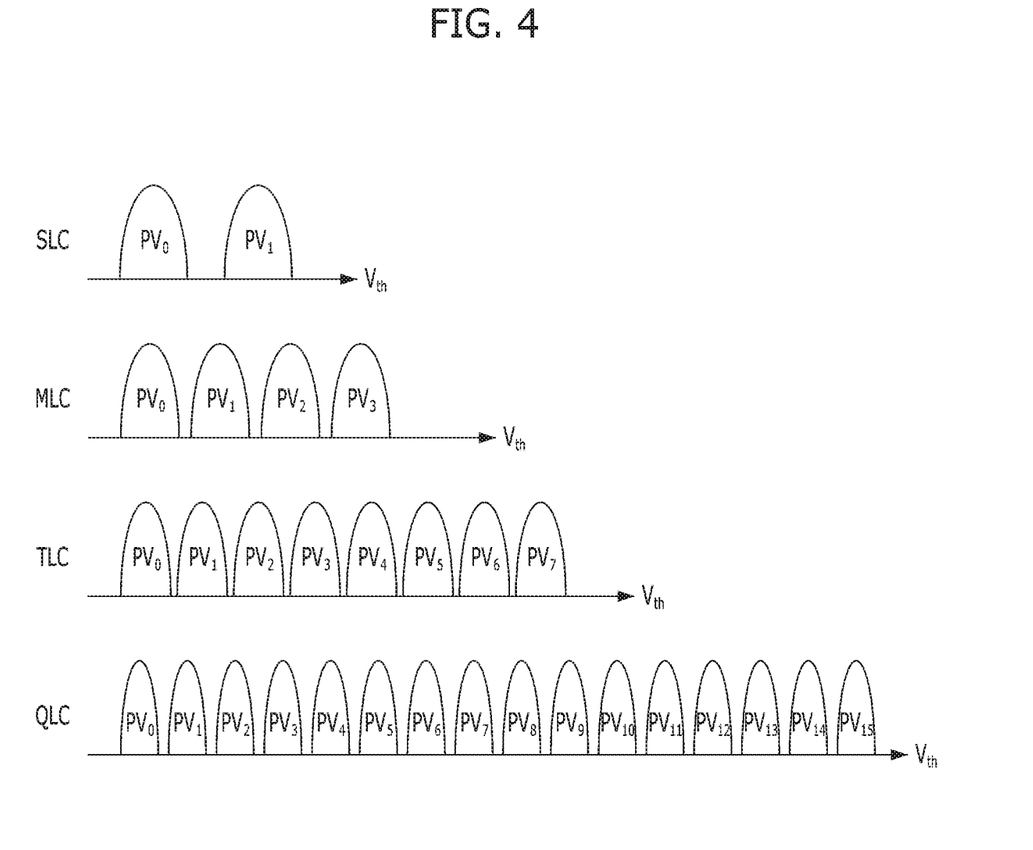
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states $PV_0$ and $PV_1$. $PV_0$ may indicate an erase state, and $PV_1$ may indicate a program state. Since the SLC can be set in one of two different states, each SLC may program or store 1 bit according to a set coding method. An MLC may include four states $PV_0$, $PV_1$, $PV_2$ and $PV_3$. Among these states, $PV_0$ may indicate an erase state, and $PV_1$ to $PV_3$ may indicate program states. Since the MLC can be set in one of four different states, each MLC may program or store two bits according to a set coding method. A TLC may include eight states $PV_0$ to $PV_7$. Among these states, $PV_0$ may indicate an erase state, and $PV_1$ to $PV_7$ may indicate program states. Since the TLC can be set in one of eight different states, each TLC may program or store three bits according to a set coding method. A QLC may include 16 states $PV_0$ to $PV_7$. Among these states, $PV_0$ may indicate an erase state, and $PV_1$ to $PV_7$ may indicate program states. Since the QLC can be set in one of sixteen different states, each QLC may program or store four bits according to a set coding method. For an n-bit multiple level cell flash memory as mentioned above, cells can be modulated into multiple states based on their program voltage levels. SLC, MLC, TLC and QLC memories can store one bit, two bits, three bits and four bits respectively in each cell using 2, 4, 8 and 16 possible states.

As such, in a memory device such as a NAND flash memory, information (or data) is stored in cells, which are grouped by pages in blocks. During read operations on the memory device, read voltage threshold (Vt) distribution of target pages in a block changes. Depending on the number of program and erase (PE) cycles or variance of characteristics in one or more physical blocks, initial read voltage threshold distributions for various blocks are different. Optimal read voltage levels are not known a priori and change over time, so they need to be repeatedly re-adjusted. Different access frequencies by a host of different blocks and variation of characteristics of the blocks may cause the read voltage threshold distributions in different blocks to change differently, both in terms of magnitude and direction. Therefore, different read biases (or voltage levels) may be required for different pages, where a read bias is a value of Vt that is used to read contents of a page from the memory device. Accordingly, embodiments provide a scheme of tracking an optimal read bias in a memory system. Assuming that all pages in a single block undergo similar stress, it is desirable to regularly or periodically track an optimal read bias for every block. If this assumption is not valid, pages with similar stress or physical characteristics should be grouped into sets and an optimal read bias should be tracked for each set. Embodiments entail temporarily adding small modifications to a read bias and computing a correction (or shift) direction of the read bias based on the number of bits that are not correctly read (denoted a fail bit count) in a read operation performed with a modified read bias. Embodiments may improve reliability and quality of service (QoS) of memory systems such as NAND-based storage devices by increasing the ratio of successful read operations.

Figure 5:
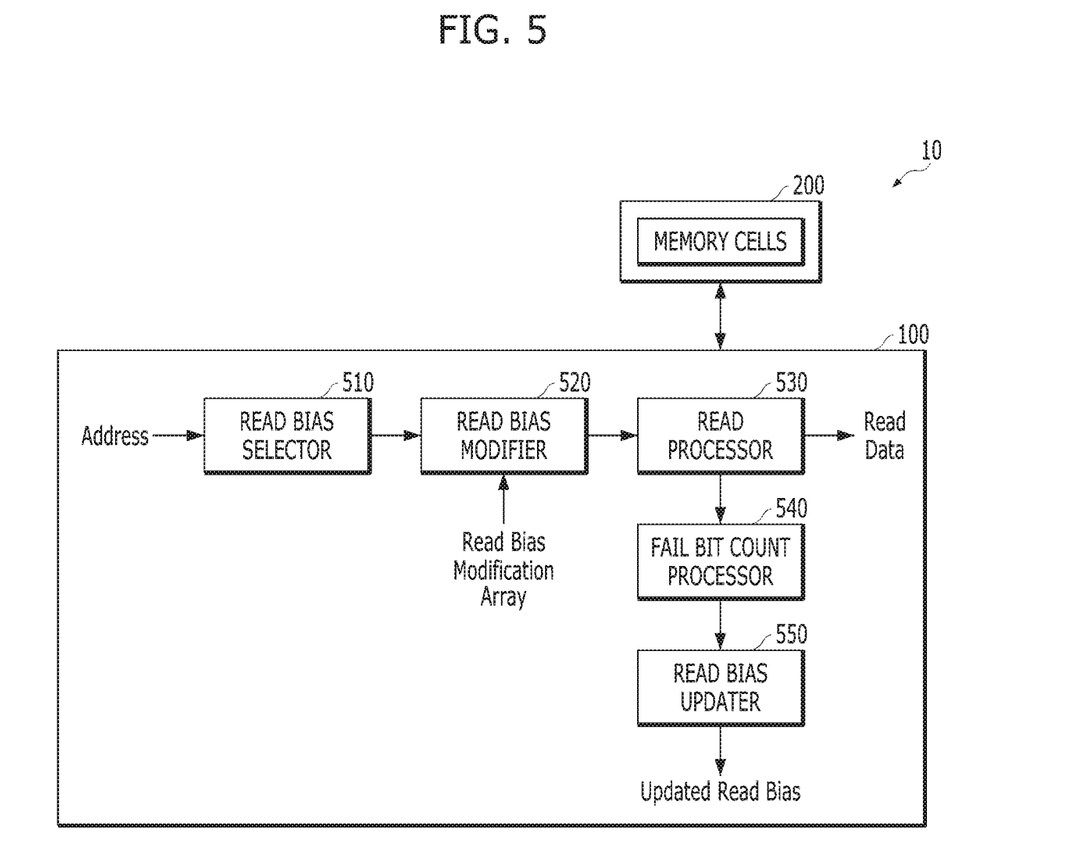
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and at a certain threshold voltage, the value of each cell can be acquired from the bit line. Multiple pages may share the memory cells that are coupled to the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

The controller 100 may include a read bias selector 510, a read bias modifier 520, a read processor 530, a fail bit count processor 540 and a read bias updater 550. Although not shown in FIG. 5, the controller 100 and the memory device 200 may include various other components of the memory system 10 as shown in FIG. 2.

The read bias selector 510 may receive a read request (or command) and a read address from a host device (e.g., a host 5 of FIG. 1). The read address may be an address for reading a select page (or a target page) among the multiple pages. The read bias selector 510 may select a read bias set including a plurality of read biases, among multiple read bias sets, in response to the read address. In some embodiments, the read bias set includes the plurality of read biases corresponding to the number of the multiple pages. The multiple read bias sets may be implemented with a read bias table in a memory (e.g., a non-volatile memory). The size of the table may be bytes of {the number of blocks}×{the number of read biases in wordline}.

The read bias modifier 520 may receive the read bias set from the read bias selector 510. The read bias modifier 520 may modify the read bias set using one of the plurality of modification arrays to generate a modified read bias set. The modification array for the page is chosen from the plurality of all modification arrays sequentially, using a certain pattern, or arbitrarily. In some embodiments, each of the plurality of modification arrays includes a plurality of elements corresponding to the plurality of read biases.

The read processor 530 may receive the modified read bias set from the read bias modifier 520. The read processor 530 may perform a read operation on the select page using the modified read bias set. Through the read operation, read data may be received from a target page of a corresponding block of the memory device 200. Decoding on the read data may be performed. If there is no decoding error, no bit is incorrectly read, and thus no fail bit count is generated. If there are decoding errors, the number of bits that were incorrectly read are counted to generate a fail bit count. Thus, the read processor 530 may generate a fail bit count (representing the number of bits incorrectly read) corresponding to each read operation. After the read processor 530 performs read operation using read bias of the modified read bias set, fail bit count may be obtained for the modification array that was used in the read bias modifier 520 for that page.

For every block or set of pages, there is a set of accumulators in the fail bit count processor 540. The number of accumulators is equal to the number of read biases in a read bias set. The fail bit count processor 540 may receive, from the read processor 530, fail bit count and add or subtract the fail bit count for every accumulator. Whether subtraction or addition is made for every accumulator depends on the values of the modification array. The accumulator values may be used to determine the direction where the corresponding read bias shall be shifted.

The read bias updater 550 may update the select read bias to generate updated read bias, based on the accumulator values. In some embodiments, the read bias updater 550 may update the select read bias by shifting the select read bias in a correction direction corresponding to the difference when the accumulator value is greater than a threshold. The read bias updater 550 may shift the select read bias in the correction direction by a set bias.

As such, embodiments observe changes of fail bit counts corresponding to modified read biases with small changes in a current read bias, determine a direction in which the current read bias is to be shifted, from multiple observations, and shift the current read bias in the determined direction. Embodiments provide higher stability since the read bias is shifted only when the difference between fail bit counts is large enough. Therefore, embodiments may decrease the chance that the read bias is accidentally moved too far from a good read bias.

Figure 6:
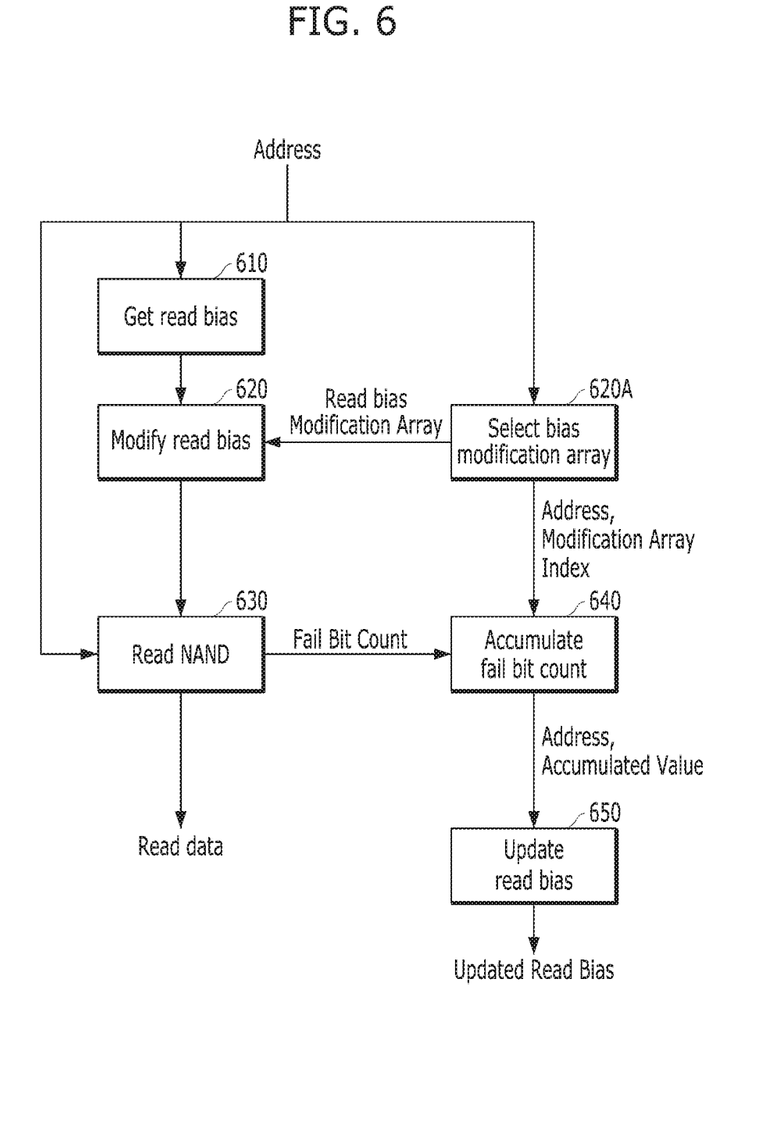
FIG. 6 is a diagram illustrating an optimal read bias tracking operation in accordance with an embodiment of the present invention.

FIG. 6 is a diagram illustrating an optimal read bias tracking operation in accordance with an embodiment of the present invention. The optimal read bias tracking operation of FIG. 6 may be performed by components of the controller 100 shown in FIG. 5.

Referring to FIG. 6, the read bias selector 510 may get a current read bias corresponding to a read address from the read bias table (610). The read bias table may be configured as a lookup table matching each read bias with one or more read addresses. A read bias modification array may be selected among a plurality of read bias modification arrays (620A) and may be applied to the read bias modifier 520. The read bias modifier 520 may modify the current read bias using the select read bias modification array (620). The select read bias modification array may be temporarily added to the current read bias to generate a modified read bias. The read processor 530 may receive the modified read bias and perform a current read operation on a memory device (e.g., a NAND flash memory device) using the modified read bias (630).

The fail bit count processor 540 may obtain, from the read processor 530, a fail bit count after the read operation using the modified read bias. The fail bit count processor 540 may receive the read address and a modification array index and accumulate fail bit counts for each of the plurality of modification arrays in response to the received information. The read bias updater 550 may receive the read address and accumulated values, update the current read bias by computing read bias correction from the accumulated values and output a updated read bias. Accumulation and read bias correction operations are described below.

Figure 7:
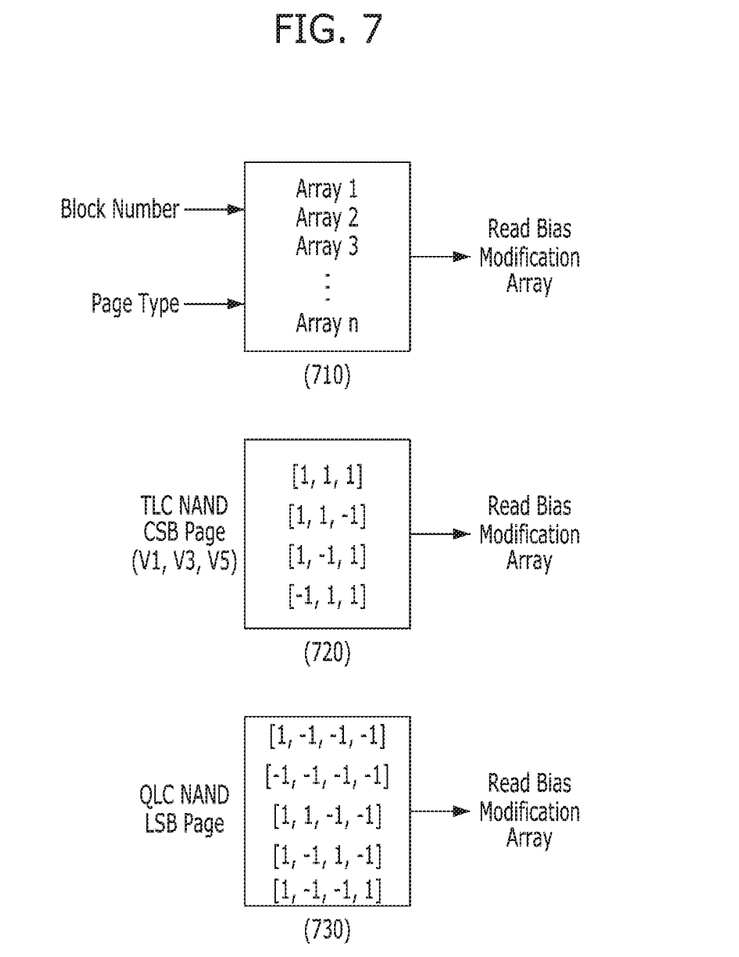
FIG. 7 illustrates examples of read bias modification arrays in accordance with an embodiment of the present invention.

FIG. 7 illustrates examples of read bias modification arrays in accordance with an embodiment of the present invention.

Referring to FIG. 7, a plurality of read bias modification arrays 710 (e.g., n read bias modification arrays) may be provided. For these arrays 710, the controller 100 may define a set of read bias modification arrays for a certain page type: {−1, 0, 1}. In this set, '−1' indicates that the read bias is decreased (negative direction modification) by the minimum possible step, i.e., 1, and '1' indicates that the read bias is increased (positive direction modification) by the minimum possible step, i.e., 1. Each of the plurality of read bias modification arrays 710 may be a combination of numbers from the set, i.e., a sequence of numbers from the set. The number of elements in each modification array may correspond to the number of read biases for the certain page type. For every page type, a list of modification arrays may be required. Modification arrays may be selected arbitrarily such that: there are at least two modification arrays with both positive and negative directions for every read bias entry in the list; and modification (or correction) directions are the same for other read bias entries. Modification arrays may be initially chosen manually, and later they may be optimized by firmware.

When the memory device 200 is implemented with TLCs, the page type may be any of MSB, CSB and LSB pages. In this implementation, if there are three read bias entries for an CSB page (e.g., V1, V3, and V5), there would be modifications with +1 and −1 for V1, V3, and V5. V1 represents a read bias to distinguish between a program state $PV_0$ and a program state $PV_1$ in FIG. 4. V3 represents a read bias to distinguish between a program state $PV_2$ and a program state $PV_3$ in FIG. 4. V5 represents a read bias to distinguish between a program state $PV_4$ and a program state $PV_5$ in FIG. 4. An example of a modification array list for CSB page of TLC NAND is shown in 720, which includes a plurality of read bias modification arrays of {[1, 1, 1], [1, 1, −1], [1, −1, 1], [−1, 1, 1]}.

When the memory device 200 is implemented with QLCs, the page type may be any of MSB, CMSB, CLSB and LSB pages. An example of a modification array list for LSB page of QLC NAND is shown in 730, which includes a plurality of read bias modification arrays of {[1, −1, −1, −1], [−1, −1, −1, −1], [1, 1, −1, −1], [1, −1, 1, −1], [1, −1, −1, 1]}.

Figure 8:
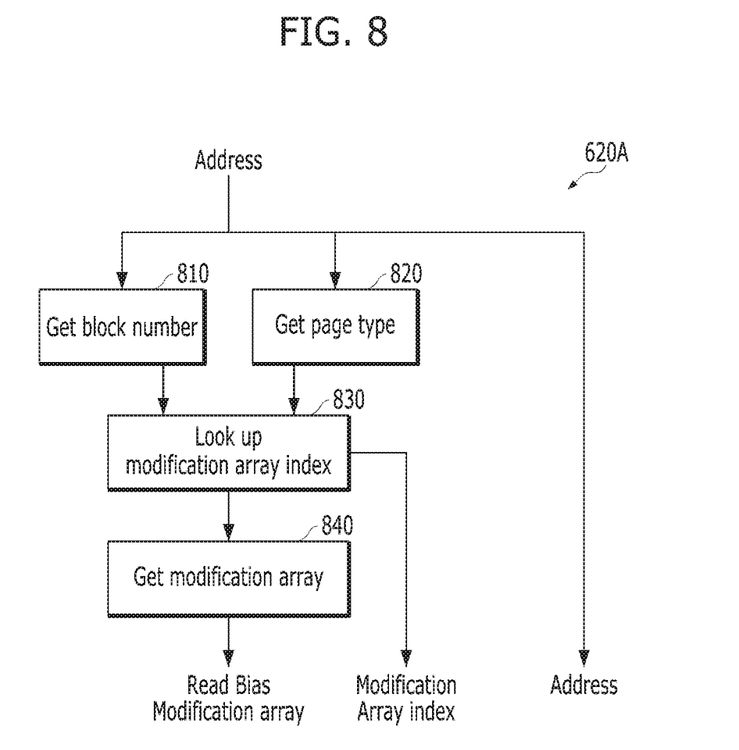
FIG. 8 is a diagram illustrating an operation of selecting a read bias modification array in accordance with an embodiment of the present invention.

FIG. 8 is a diagram illustrating the operation 620A of selecting a read bias modification array in accordance with an embodiment of the present invention. The operation 620A may be performed by the controller 100 in FIG. 5.

Referring to FIG. 8, the controller 100 may get a block number and a page type in response to a read address from a host device (810, 820). The controller 100 may look up a modification array index corresponding to the block number and the page type (830). After a certain modification array from a list is selected and used for a current read operation, a modification array index is incremented to select another modification array with the new index to be used on a next read operation to the same block and page type. The controller 100 may get a read bias modification array among a plurality of read bias modification arrays in the list, based on the modification index (840).

Figure 9:
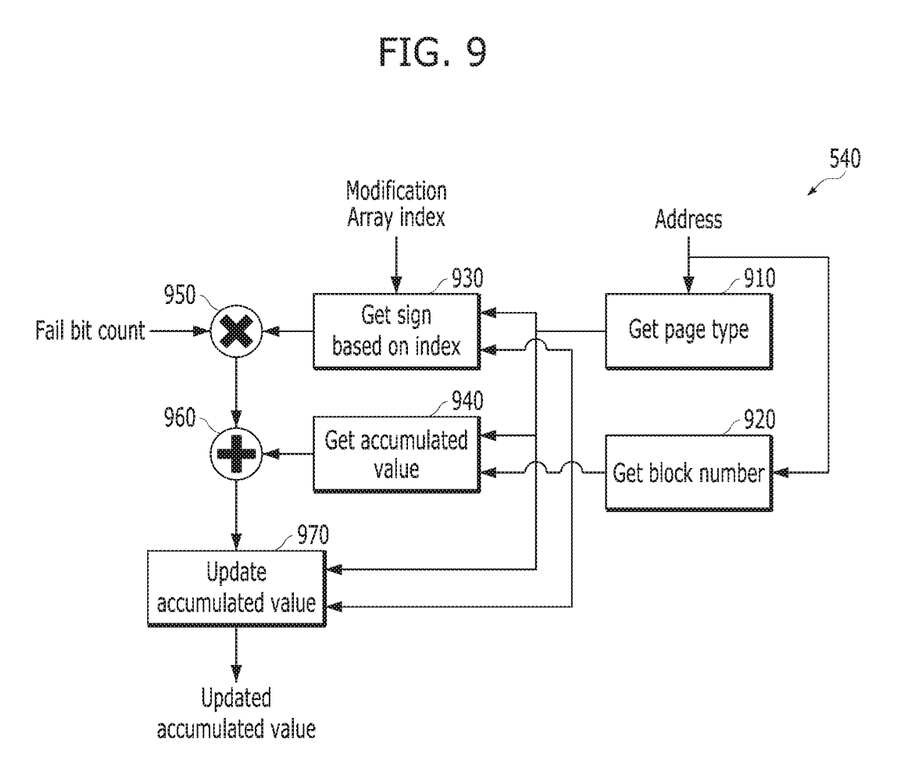
FIG. 9 is a diagram illustrating an operation of a fail bit count processor in accordance with an embodiment of the present invention.

FIG. 9 is a diagram illustrating an operation of the fail bit count processor 540 in accordance with an embodiment of the present invention.

Referring to FIG. 9, the fail bit count processor 540 may get a page type and a block number from a read address (910, 920). The fail bit count processor 540 may include an array of adders (or accumulators) for every (block, page type) pair, which corresponds to an array of read bias modification arrays. The length of each accumulator may be equal to the number of read biases for the page type. Although for clarity it is illustrated that only one adder is included in the fail bit count processor 540, it is implemented with an array of adders.

Once the read operation with a modified read bias is completed, the fail bit count processor 540 may receive the acquired fail bit count through the read operation as well as the modification array index of a read bias modification array in a list that was used for the read operation. The acquired fail bit count may be either subtracted or added to an accumulated fail bit count value. For this, the fail bit count processor 540 may include a multiplier 950 and an adder 960.

The fail bit count processor 540 may get a sign (i.e., + or − denoting positive or negative modification) from a corresponding element of a read bias modification array corresponding to the modification array index (930). The multiplier 950 may multiply the fail bit count by the sign. The adder 960 may add the multiplication result of the multiplier 950 to an accumulated value of previous fail bit counts (940). The fail bit count processor 540 may update an accumulated value of fail bit counts using the addition result of the adder 960 to generate updated accumulated value (970).

The fail bit count accumulation operation of the fail bit count processor 540 above is described with the following equation (1):

$$\begin{cases} f_1^{(s_1^1)} + f_2^{(s_1^2)} + \ldots + f_i^{(s_1^i)} + \ldots + f_m^{(s_1^m)} = F_1 \\ f_1^{(s_2^1)} + f_2^{(s_2^2)} + \ldots + f_i^{(s_2^i)} + \ldots + f_m^{(s_2^m)} = F_2 \\ f_1^{(s_k^1)} + f_2^{(s_k^2)} + \ldots + f_i^{(s_k^i)} + \ldots + f_m^{(s_k^m)} = F_k \\ f_1^{(s_n^1)} + f_2^{(s_n^2)} + \ldots + f_i^{(s_n^i)} + \ldots + f_m^{(s_n^m)} = F_n \end{cases} \quad (1)$$

In equation (1), $F_k$ is a fail bit count for kth read bias modification array, $f_i$ is a fail bit count produced by an ith read bias, and $s_k^i$ is sign of the ith element of kth read bias modification array which indicates a shift direction of temporary read bias. k has values in the range of 1 to n, where n is the number of read bias modification arrays. i has a range from 1 to m, where m is the number of read biases for a certain page type. If a value of $s_k^i$ is positive '+', it indicates that a current ith read bias is modified in the positive direction a set bias. Thus, $f_i^+$ represents a fail bit count for the modified read bias, is shifted in the positive direction from the current ith read bias an amount represented by the set bias. If a value of $s_k^i$ is negative '−', it indicates that a current ith read bias is modified in the negative direction the set bias. Thus, $f_i^-$ represents a fail bit count for the modified read bias, is shifted in the negative direction from the current ith read bias an amount represented by the set bias. If a value of $s_k^i$ is zero, it indicates that $f_i$ does not participate in the corresponding equation.

When the fail bit count accumulation operation is applied to an LSB page of QLC NAND memory device, the read bias modification arrays are as shown in (730) of FIG. 7: [1, −1, −1, −1], [−1, −1, −1, −1], [1, 1, −1, −1], [1, −1, 1, −1], [1, −1, −1, 1]. Thus, equation (1) becomes equation (2):

$$\begin{cases} f_1^+ + f_2^- + f_3^- + f_4^- = F_1 \\ f_1^- + f_2^- + f_3^- + f_4^- = F_2 \\ f_1^+ + f_2^+ + f_3^- + f_4^- = F_3 \\ f_1^+ + f_2^- + f_3^+ + f_4^- = F_4 \\ f_1^+ + f_2^- + f_3^- + f_4^+ = F_5 \end{cases} \quad (2)$$

The operation for determining a correction direction of a current read bias depends on the sign that $F_k$ has if the equation (2) is solved with respect to $f_i^- - f_i^+$. Thus, if the equation (2) is solved for $f_i^- - f_i^+$, the following equation (3) is obtained:

$$\begin{cases} f_1^- - f_1^+ = F_2 - F_1 \\ f_2^- - f_2^+ = F_1 - F_3 \\ f_3^- - f_3^+ = F_1 - F_4 \\ f_4^- - f_4^+ = F_1 - F_5 \end{cases} \quad (3)$$

In equation (3), the difference between fail bit counts is the value that is computed in the accumulator. For example, the difference between a fail bit count for the modified first read bias in the negative direction and a fail bit count for the modified first read bias in the positive direction, i.e., $\{f_1^- - f_1^-\}$, is calculated by accumulating the difference between ($F_1$) fail bit count for the first read bias modification array and ($F_2$) fail bit count for the second read bias modification array. The difference between a fail bit count for the modified second read bias in the negative direction and a fail bit count for the modified second read bias in the positive direction, i.e., $\{f_2^- - f_2^+\}$, is calculated by accumulating the difference between ($F_3$) fail bit count for the first read bias modification array and ($F_1$) fail bit count for the first read bias modification array. The difference between a fail bit count for the modified third read bias in the negative direction and a fail bit count for the modified third read bias in the positive direction, i.e., $\{f_3^- - f_3^+\}$, is calculated by accumulating the difference between ($F_4$) fail bit count for the first read bias modification array and ($F_1$) fail bit count for the first read bias modification array. The difference between a fail bit count for the modified fourth read bias in the negative direction and a fail bit count for the modified fourth read bias in the positive direction, i.e., $\{f_4^- - f_4^+\}$ is calculated accumulating the difference between ($F_5$) fail bit count for the first read bias modification array and ($F_1$) fail bit count for the first read bias modification array.

In order to implement equation (3), the fail bit count processor 540 may obtain fail bit count after the read operation is completed. Then the fail bit count processor 540 may add the obtained fail bit count to a certain adder (or accumulator) or subtract the obtained fail bit count from a certain adder. The fail bit count processor 540 may include first to fourth adders with respect to equation (3). In other words, the first adder calculates an accumulation result ($F_2 - F_1$) of fail bit counts, which are obtained from the read operation using the first and the second read bias modification arrays. The second adder calculates an accumulation result ($F_1 - F_3$) of fail bit counts, which are obtained from the read operation using the first and the second read bias modification arrays. The third adder calculates an accumulation result ($F_1 - F_4$) of fail bit counts, which are obtained from the read operation using the first and the third read bias modification arrays. The fourth adder calculates an accumulation result ($F_1 - F_5$) of fail bit counts, which are obtained from the read operation using the first and the fourth read bias modification arrays.

After the read operations with the first read bias modification array [1, −1, −1, −1] are completed, the fail bit count processor 540 may subtract the acquired fail bit counts from the first adder (i.e., −$F_1$) and add the acquired fail bit counts to the second, third and fourth adders (i.e., $F_1$). Also, fail bit counts, which are obtained from the read operations using the second read bias modification array [−1, −1, −1, −1], are added to the first adder such that the result ($F_2 - F_1$) in the equation (3) is calculated. Next, fail bit counts, which are obtained from the read operations using the third read bias modification array [1, 1, −1, −1], are subtracted from the second adder such that the result ($F_1 - F_3$) in the equation (3) is calculated. Further, fail bit counts, which are obtained from the read operations using the fourth read bias modification array [1, −1, 1, −1], are subtracted from the third adder such that the result ($F_1 - F_4$) in the equation (3) is calculated. Furthermore, fail bit counts, which are obtained from the read operations using the fifth read bias modification array [1, −1, −1, 1], are subtracted from the fourth adder such that the result ($F_1 - F_5$) in the equation (3) is calculated.

The following lists List1 and List2 show flows of read operations on an LSB page of QLC NAND memory device using the read bias modification arrays in (730) of FIG. 7, and fail bit count accumulation operations. Although the flows of List1 and List2 shows operations associated with the first and second read bias modification arrays in (730) of FIG. 7, operations associated with the third and fourth read bias modification arrays are similarly performed.

List1:

(Step 1) All adders and current modification array indices are set to 0.
(Step 2) First read operation happens to be LSB page.
(Step 3) Select the first modification array [1, −1, −1, −1] from the modification array list.
(Step 4) Current modification array index is incremented and set to 1.
(Step 5) Add the first modification array to a current read bias and perform
the read operation with the modified read biases.
(Step 6) Fail bit count $F_1$ is acquired.
(Step 7) Subtract $F_1$ from the first adder for the LSB page, and add it to other adders of the LSB page.

List2:

(Step 1) LSB page happens to be read again.
(Step 2) The second array [−1, −1, −1, −1] is selected from the modification array list.
(Step 3) Current modification array index is incremented and set to 2.
(Step 4) A read operation with the modified read bias is performed.
(Step 5) A fail bit count $F_2$ is acquired.
(Step 6) Its value is added to the first adder for the LSB page.

As such, the fail bit count processor 540 may calculate an accumulation result of fail bit counts for each read bias modification array and estimate the value $\{f_i^- - f_i^+)\}$. The read bias updater 550 may find a correction direction of the ith read bias using the estimated value $\{f_i^- - f_i^+\}$. If the value $\{f_i^- - f_i^+\}$ is greater than a certain threshold, the read bias updater 550 assesses its sign. If the sign is positive, the read bias updater 550 determines that the ith read bias is to be shifted in the positive direction. Otherwise, the read bias updater 550 determines that the ith read bias is to be shifted in the negative direction. If the value $\{f_i^- - f_i^+\}$ is less than or equal to the threshold, no modification to corresponding read bias is made. After finding the required correction direction, the read bias updater 550 modifies read bias values that correspond to the (block, page type) pair with the correction direction.

As described above, embodiments provide a scheme of tracking an optimal read bias in a memory system. Embodiments temporarily add small modifications to a read bias and compute a magnitude and direction by which the read bias is corrected or shifted based on values of fail bit count, which is obtained from a read operation with modified read bias. Embodiments improve reliability and quality of service (QoS) of memory systems such as NAND-based storage devices by increasing the ratio of successful read operations.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:
1. A memory system comprising:
a memory device including a plurality of cells associated with multiple pages; and
a controller coupled to the memory device and suitable for:
selecting a read bias set including a plurality of read biases in response to an address for reading a select page among the multiple pages;
modifying the read bias set to generate a modified read bias set using one of a plurality of modification arrays, wherein a number of elements in each modification array corresponds to a number of read biases for the select page, and each modification array has a modification array list containing a matrix entry designating a correction of a select read bias between different program states;
performing a read operation on the select page using the modified read bias set having been modified by the correction designated in the modification array list;
accumulating, for the select read bias of the read bias set, a fail bit count corresponding to a read operation using a select modified read bias, associated with the matrix entry designating the correction, of the modified read bias set; and when the absolute accumulator value is greater than a threshold, updating the select read bias by shifting the select read bias in a correction direction by a specific magnitude corresponding to the accumulator sign.

2. The memory system of claim 1, wherein the plurality of cells includes a group of triple-level cells (TLCs) and the multiple pages include a most significant bit (MSB) page, a center significant bit (CSB) page and a least significant bit (LSB) page.

3. The memory system of claim 2, wherein the read bias set includes 3 read biases.

4. The memory system of claim 1, wherein the plurality of cells includes a group of quadruple-level cells (QLCs) and the multiple pages include a most significant bit (MSB) page, a center most significant bit (CMSB) page, a center least significant bit (CLSB) page and a least significant bit (LSB) page.

5. The memory system of claim 4, wherein the read bias set includes 4 read biases.

6. The memory system of claim 1, wherein the read bias set includes the plurality of read biases corresponding to the number of the multiple pages and each of the plurality of modification arrays includes a plurality of elements corresponding to the plurality of read biases.

7. The memory system of claim 6, wherein the controller selects each of the plurality of modification arrays and modifies each read bias of the read bias set using the select modification array to generate the modified read bias set.

8. The memory system of claim 7, wherein the controller adds fail bit counts for each of the plurality of modification arrays, which are obtained through read operations using read biases in each set of the modified read bias set.

9. The memory system of claim 8, wherein the controller accumulates the fail bit count using multiple additions or subtractions to a set of the corresponding accumulators.

10. The memory system of claim 1, wherein the controller shifts the select read bias to the correction direction corresponding to a sign of the accumulated value, when its absolute value exceeds a certain threshold.

11. A method for operating a memory system, which includes a memory device including a plurality of cells associated with multiple pages and a controller, the method comprising:

selecting a read bias set including a plurality of read biases in response to an address for reading a select page among the multiple pages;

modifying the read bias set to generate a modified read bias set using one of a plurality of modification arrays, wherein a number of elements in each modification array corresponds to a number of read biases for the select page, and each modification array has a modification array list containing a matrix entry designating a correction of a select read bias between different program states;

performing a read operation on the select page using the modified read bias set having been modified by the correction designated in the modification array list;

accumulating, for the select read bias of the read bias set, a fail bit count corresponding to a read operation using a select modified read bias, associated with the matrix entry designating the correction, of the modified read bias set; and when the absolute accumulator value is greater than a threshold, updating the select read bias by shifting the select read bias in a correction direction by a specific magnitude corresponding to the accumulator sign.

12. The method of claim 11, wherein the plurality of cells includes a group of triple-level cells (TLCs) and the multiple pages include a most significant bit (MSB) page, a center significant bit (CSB) page and a least significant bit (LSB) page.

13. The method of claim 12, wherein the read bias set includes 3 read biases.

14. The method of claim 11, wherein the plurality of cells includes a group of quadruple-level cells (QLCs) and the multiple pages include a most significant bit (MSB) page, a center most significant bit (CMSB) page, a center least significant bit (CLSB) page and a least significant bit (LSB) page.

15. The method of claim 14, wherein the read bias set includes 4 read biases.

16. The method of claim 11, wherein the read bias set includes the plurality of read biases corresponding to the number of the multiple pages and each of the plurality of modification arrays includes a plurality of elements corresponding to the plurality of read biases.

17. The method of claim 16, further comprising:
selecting each of the plurality of modification arrays, and wherein the modifying of the read bias set comprises:
modifying each read bias of the read bias set using the select modification array to generate the modified read bias set.

18. The method of claim 17, further comprising:
adding fail bit counts for each of the plurality of modification arrays, which are obtained through read operations using read biases in each set of the modified read bias set.

19. The method of claim 18, wherein the accumulating of the fail bit count comprises:
accumulating the fail bit count using multiple subtractions or additions of fail bit counts for the plurality of accumulators.

20. The method of claim 11, wherein the updating of the select read bias comprises:
shifting the select read bias to the correction direction corresponding to a sign of the corresponding accumulator, when its absolute value exceeds a certain threshold.

* * * * *